(12) United States Patent
Walker

(10) Patent No.: US 10,128,215 B1
(45) Date of Patent: Nov. 13, 2018

(54) PACKAGE INCLUDING A PLURALITY OF STACKED SEMICONDUCTOR DEVICES HAVING AREA EFFICIENT ESD PROTECTION

(71) Applicant: Darryl G. Walker, San Jose, CA (US)

(72) Inventor: Darryl G. Walker, San Jose, CA (US)

( * ) Notice: Subject to any disclaimer, the term of this patent is extended or adjusted under 35 U.S.C. 154(b) by 107 days.

(21) Appl. No.: 15/259,735

(22) Filed: Sep. 8, 2016

Related U.S. Application Data

(60) Provisional application No. 62/296,007, filed on Feb. 16, 2016.

(51) Int. Cl.
| | |
|---|---|
| *H03B 1/00* | (2006.01) |
| *H03K 3/00* | (2006.01) |
| *H01L 25/065* | (2006.01) |
| *H01L 27/02* | (2006.01) |
| *H03K 17/687* | (2006.01) |

(52) U.S. Cl.
CPC ...... *H01L 25/0657* (2013.01); *H01L 27/0255* (2013.01); *H01L 27/0266* (2013.01); *H03K 17/6872* (2013.01); *H01L 2225/06544* (2013.01)

(58) Field of Classification Search
CPC .................. H01L 27/0248; H01L 25/0657
USPC ........................................... 327/108; 361/783
See application file for complete search history.

(56) References Cited

U.S. PATENT DOCUMENTS

| | | | | |
|---|---|---|---|---|
| 5,859,758 A | * | 1/1999 | Kim | H02H 9/046 361/111 |
| 6,351,187 B1 | | 2/2002 | Lu | |
| 7,406,642 B1 | * | 7/2008 | Lau | G01R 31/31715 714/727 |
| 7,715,164 B2 | | 5/2010 | Huang et al. | |
| 8,426,889 B2 | | 4/2013 | Adachi et al. | |
| 8,455,918 B2 | | 6/2013 | Adachi et al. | |
| 9,293,913 B2 | | 3/2016 | Umeda et al. | |

(Continued)

OTHER PUBLICATIONS

U.S. Appl. No. 62/296,007, filed Feb. 16, 2016, to which the present application claims priority.

(Continued)

*Primary Examiner* — Lincoln D Donovan
*Assistant Examiner* — Metasebia T Retebo

(57) ABSTRACT

A package may include a plurality of stacked semiconductor devices (chips) is disclosed. Each chip may include through vias (through silicon vias—TSV) that can provide an electrical connection between chips and between chips and external connections, such as solder connections or solder balls. Electro static discharge (ESD) protection circuitry may be placed on a bottom chip in the stack even when through vias connect circuitry on a top chip in the stack exclusive of the bottom chip. In this way, ESD protection circuitry may be placed in close proximity to the ESD event occurring at an external connection. In particular, every chip in the stack of semiconductor chips may have circuitry electrically connected to the external connection and by placing ESD protection circuitry on the bottom chip closest to the electrical connection, instead of on all chips ESD protection may be more area efficient. Furthermore, by only placing ESD protection circuitry on a bottom chip in a stack of semiconductor chips, ESD protection circuitry may not be included on other chips, so that total area may be reduced and more chips may be produced on a single silicon wafer.

19 Claims, 6 Drawing Sheets

(56) References Cited

U.S. PATENT DOCUMENTS

| | | | |
|---|---|---|---|
| 2001/0050578 A1* | 12/2001 | Yamamoto | G11C 29/006 |
| | | | 326/16 |
| 2005/0104618 A1* | 5/2005 | Han | H03K 19/00323 |
| | | | 326/27 |
| 2007/0052109 A1* | 3/2007 | Chen | H01L 24/11 |
| | | | 257/778 |
| 2010/0133701 A1* | 6/2010 | Saiki | H01L 23/481 |
| | | | 257/774 |
| 2011/0210418 A1* | 9/2011 | Esmark | H01L 23/60 |
| | | | 257/517 |
| 2012/0162836 A1* | 6/2012 | Furuta | H01L 23/62 |
| | | | 361/56 |
| 2013/0009278 A1 | 1/2013 | Lee | |
| 2016/0285255 A1 | 9/2016 | O'Donnell et al. | |
| 2017/0040041 A1 | 2/2017 | Song | |

OTHER PUBLICATIONS

Notice of Allowance, dated Apr. 27, 2017, for U.S. Appl. No. 15/259,693, filed Sep. 8, 2016.

Office Action, dated Mar. 21, 2018, for U.S. Appl. No. 15/259,735, filed Sep. 8, 2016.

Office Action, dated Mar. 8, 2018, for U.S. Appl. No. 15/259,759, filed Sep. 8, 2016.

* cited by examiner

US 10,128,215 B1

PACKAGE INCLUDING A PLURALITY OF STACKED SEMICONDUCTOR DEVICES HAVING AREA EFFICIENT ESD PROTECTION

This application claims the benefit of U.S. Provisional Patent Application Ser. No. 62/296,007, filed Feb. 16, 2016, the contents of which are incorporated by reference herein.

TECHNICAL FIELD

The present invention relates generally to a multi-chip semiconductor device, and more particularly to improving ESD efficiency in a multi-chip semiconductor device.

BACKGROUND OF THE INVENTION

Multi-chip semiconductor packages can include a plurality of semiconductor devices. Each semiconductor device can include ESD protection at each pad or contact between circuitry on the semiconductor device and an external connection. This can consume surface area on each semiconductor device that could be used for other circuitry.

In light of the above, it would be desirable to provide a ESD protection in an area efficient manner in packaged stacked multi-chip semiconductor devices.

DETAILED DESCRIPTION OF THE EMBODIMENTS

According to the embodiments set forth below, a package may include a plurality of stacked semiconductor devices (chips). Each chip may include through vias (through silicon vias—TSV) that can provide an electrical connection between chips and between chips and external connections, such as solder connections or solder balls. In particular, through vias may provide an electrical connection from a first side of a semiconductor device directly through the semiconductor device to a second (opposite) surface of the semiconductor device. Electro static discharge (ESD) protection circuitry may be placed on a bottom chip in the stack even when through vias connect circuitry (input buffers, output buffers, and/or other functional circuits when the external connection provides a power supply potential or ground potential, for example) on a top chip in the stack exclusive of the bottom chip. In this way, ESD protection circuitry may be placed in close proximity to the ESD event occurring at an external connection. In particular, every chip in the stack of semiconductor chips may have circuitry electrically connected to the external connection and by only placing ESD protection circuitry on the bottom chip closest to the electrical connection, instead of on all chips ESD protection may be more area efficient. Furthermore, by only placing ESD protection circuitry on a bottom chip in a stack of semiconductor chips, ESD protection circuitry may not be included on other chips, so that total area may be reduced and more chips may be produced on a single silicon wafer.

The term ESD circuitry may be used for ESD protection circuitry on a semiconductor device. ESD protection circuitry may provide a high current discharge path during ESD events, so that functional circuitry, such as input buffers, output buffers, or circuits connected to a power supply potential or reference potential can avoid damage.

Figure 1:
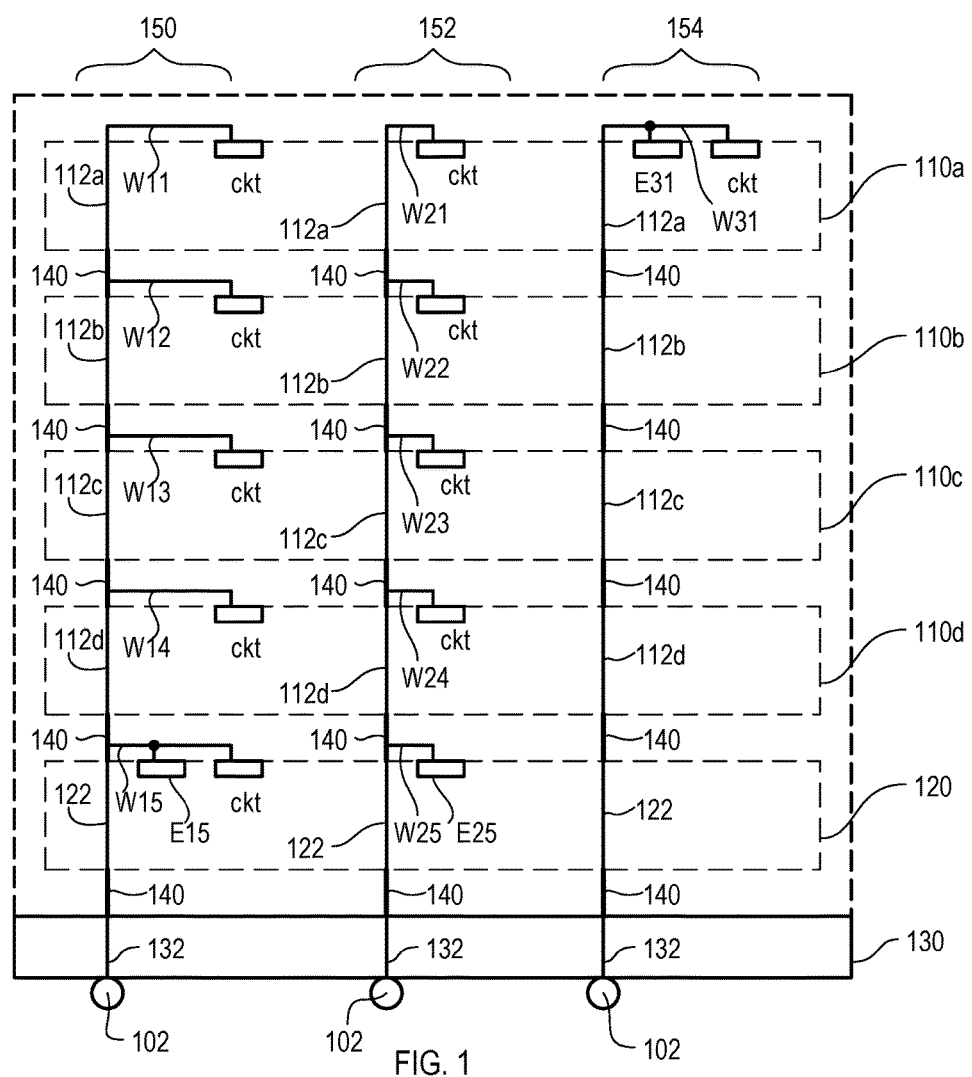
FIG. 1 is a schematic diagram of a package including a plurality of semiconductor devices according to an embodiment.

Referring now to FIG. 1, a package including a plurality of stacked semiconductor devices according to an embodiment is set forth in a schematic diagram and given the general reference character 100.

Package 100 may have external connections 102 for providing or receiving signals, power supply potentials, and/or reference potentials to/from devices and/or circuitry external to the package 100. External connections 102 may be arranged in a matrix pattern on a bottom surface of package 100. Only a selected few of external connections 102 are illustrated to avoid unduly cluttering up the figure.

Package can include semiconductor devices (110a, 110b, 110c, 110d, and 120) stacked vertically. Semiconductor device 120 can be a bottom semiconductor device. Bottom semiconductor device 120 may be closest to external connections 102. External connections 102 may be electrically connected to bottom semiconductor device by way of wiring 132 formed in an interposer 130 and electrical interface connections 140. Bottom semiconductor device 120 may include through vias 122 to provide an electrical connection between top and bottom surfaces of bottom semiconductor device 120. Some through vias 122 may provide electrical connections between external connections 102 and structures on an active surface of bottom semiconductor device 120 and some through vias 122 may just provide an electrical connection between external connections 102 and semiconductor devices (110a to 110d) formed above bottom semiconductor device 120 in the stack.

Semiconductor device 110d may be stacked on a top surface of semiconductor device 120. External connections 102 may be electrically connected to semiconductor device 110d by way of wiring 132 formed in an interposer 130, electrical interface connections 140 formed between interposer 130 and bottom semiconductor device 120, through vias 122, and electrical interface connections 140 formed between bottom semiconductor device 120 and semiconductor device 110d. Semiconductor device 110d may include through vias 112d. Some through vias 112d may provide electrical connections between external connections 102 and structures on an active surface of semiconductor device 110d and some through vias 112*d* may just provide an electrical connection between external connections 102 and semiconductor devices (110*a* to 110*c*) formed above bottom semiconductor device 112*d* in the stack.

Semiconductor device 110*c* may be stacked on a top surface of semiconductor device 110*d*. External connections 102 may be electrically connected to semiconductor device 110*c* by way of wiring 132 formed in an interposer 130, electrical interface connections 140 formed between interposer 130 and bottom semiconductor device 120, through vias 122, electrical interface connections 140 formed between bottom semiconductor device 120 and semiconductor device 110*d*, through vias 112*d*, and electrical interface connections 140 formed between semiconductor device 110*d* and semiconductor device 110*c*. Semiconductor device 110*c* may include through vias 112*c*. Some through vias 112*c* may provide electrical connections between external connections 102 and structures on an active surface of semiconductor device 110*c* and some through vias 112*c* may just provide an electrical connection between external connections 102 and semiconductor devices (110*b* and 110*a*) formed above bottom semiconductor device 112*c* in the stack.

Semiconductor device 110*b* may be stacked on a top surface of semiconductor device 110*c*. External connections 102 may be electrically connected to semiconductor device 110*b* by way of wiring 132 formed in an interposer 130, electrical interface connections 140 formed between interposer 130 and bottom semiconductor device 120, through vias 122, electrical interface connections 140 formed between bottom semiconductor device 120 and semiconductor device 110*d*, through vias 112*d*, electrical interface connections 140 formed between semiconductor device 110*d* and semiconductor device 110*c*, through vias 112*c*, and electrical interface connections 140 formed between semiconductor device 110*c* and semiconductor device 110*b*. Semiconductor device 110*b* may include through vias 112*b*. Some through vias 112*b* may provide electrical connections between external connections 102 and structures on an active surface of semiconductor device 110*b* and some through vias 112*b* may just provide an electrical connection between external connections 102 and semiconductor device 110*a* formed above bottom semiconductor device 112*b* in the stack.

Semiconductor device 110*a* may be stacked on a top surface of semiconductor device 110*b*. Semiconductor device 110*a* may be a top semiconductor device formed farthest away from external connections 102. External connections 102 may be electrically connected to top semiconductor device 110*a* by way of wiring 132 formed in an interposer 130, electrical interface connections 140 formed between interposer 130 and bottom semiconductor device 120, through vias 122, electrical interface connections 140 formed between bottom semiconductor device 120 and semiconductor device 110*d*, through vias 112*d*, electrical interface connections 140 formed between semiconductor device 110*d* and semiconductor device 110*c*, through vias 112*c*, electrical interface connections 140 formed between semiconductor device 110*c* and semiconductor device 110*b*, through vias 112*b* and electrical interface connections 140 formed between semiconductor device 110*b* and semiconductor device 110*a*. Through vias 112*a* may provide electrical connections between external connections 102 and structures on an active surface of top semiconductor device 110*a*.

Through vias (112*a*-112*d* and 122) provide an electrical connection directly through the respective semiconductor devices (110*a*-110*d* and 120) from a first surface to a second (opposite) surface.

All external connections 102 that are electrically connected to circuitry ckt on the stack of semiconductor devices (110*a* to 110*d* and 120) need ESD protection circuitry to prevent catastrophic failures in case of an ESD event.

In conventional devices, ESD protection circuit is placed on every externally connected terminal of each semiconductor device.

Package 100 illustrates various externally connected structures (150, 152, and 154) which include area efficient ESD protection circuitry. Externally connected structure 150 illustrates a case in which circuitry ckt on each semiconductor device (110*a* to 110*d* and 120) are electrically connected to an external connection 102 by way of wiring 132, through vias (112*a* to 112*d*, and 122), electrical interface connections 140, and respective wirings (W11 to W15).

Externally connected structure 152 illustrates a case in which circuitry ckt on semiconductor devices (110*a* to 110*d*) are electrically connected to an external connection 102 by way of wiring 132, through vias (112*a* to 112*d*, and 122), electrical interface connections 140, and respective wirings (W21 to W24).

Externally connected structure 154 illustrates a case in which circuitry ckt only on top semiconductor device 110*a* is electrically connected to an external connection by way of wiring 132, through vias (112*a* to 112*d*, and 122), electrical interface connections 140, and respective wiring W31.

Externally connected structure 150 may include only one ESD protection circuit E15 on bottom semiconductor device 120 and electrically connected by wiring W15 to external connection 102 by way of through via 122 and electrical interface connection 140. ESD protection circuit E15 may intervene circuitry ckt and external connection 102. All other semiconductor devices (110*a* to 110*d*) are absent ESD protection circuitry, such as ESD protection circuit E15, electrically connected to externally connected structure 150 even though each semiconductor device (110*a* to 110*d*) may have circuitry ckt including a terminal electrically connected to externally connected structure 150 by way of respective wiring (W11 to W14). Only bottom semiconductor device 120 may have ESD protection circuit E15 to discharge current in case of an ESD event. By putting the ESD protection circuit E15 on the bottom semiconductor device 120 closest to external connections 102, ESD protection circuitry may not be needed on the other semiconductor devices (110*a* to 110*d*) having a common connection to the external connection 102 included in externally connected structure 150. In this way, silicon real estate may be reduced and cost may be reduced by providing more chips per wafer.

Externally connected structure 152 may also only include one ESD protection circuit E25 on bottom semiconductor device 120 and electrically connected by wiring W25 to external connection 102 by way of through via 122 and electrical interface connection 140. No other circuitry on bottom semiconductor device 120 may be electrically connected to external connection 102 in externally connected structure 152. All other semiconductor devices (110*a* to 110*d*) are absent ESD protection circuitry, such as ESD protection circuit E25, electrically connected to externally connected structure 152. However, all other semiconductor devices (110*a* to 110*d*) have circuitry ckt including a terminal electrically connected to externally connected structure 152 by way of respective wiring (W21 to W24). Only bottom semiconductor device 120 may have ESD protection circuit E25 to discharge current in case of an ESD event even though no other circuitry is electrically connected to the external connection 102 in externally connected structure 152. By putting the ESD protection circuit E25 on the bottom semiconductor device 120 closest to external connections 102, ESD protection circuitry may not be needed on the other semiconductor devices (110a to 110d) having a common connection to the external connection 102 included in externally connected structure 152. In this way, silicon real estate may be reduced and cost may be reduced by providing more chips per wafer.

Externally connected structure 154 illustrates a case in which only top semiconductor device 110a is electrically connected to external connection 102 in externally connected structure 154. In this case, efficiency may not be improved by providing an ESD protection circuit on bottom semiconductor device 120 due to the need for wiring. Thus, an ESD protection circuit E31 may be included on top semiconductor device 110a and electrically connected to external connection 102 by way of wiring W31, electrical interface connections 140, through vias (112a to 112d and 122) and wiring 132. ESD protection circuit E31 may intervene circuitry ckt and external connection 102 in externally connected structure 154.

Each of externally connected structures (150, 152, and 154) may provide an input terminal for control signals, data signals, or the like by way of external connection 102. Each of externally connected structures (150, 152, and 154) may provide an output terminal for control signals, data signals, or the like by way of external connection 102. Also, each of externally connected structures (150, 152, and 154) may provide an input terminal for a power supply a reference potential, or the like by way of external connection 102.

Electrical interface connections 140 may include solder connections, such as solder balls and/or copper pillars, or the like. External connections 102 may include solder connections, pins, or the like.

Figure 2:
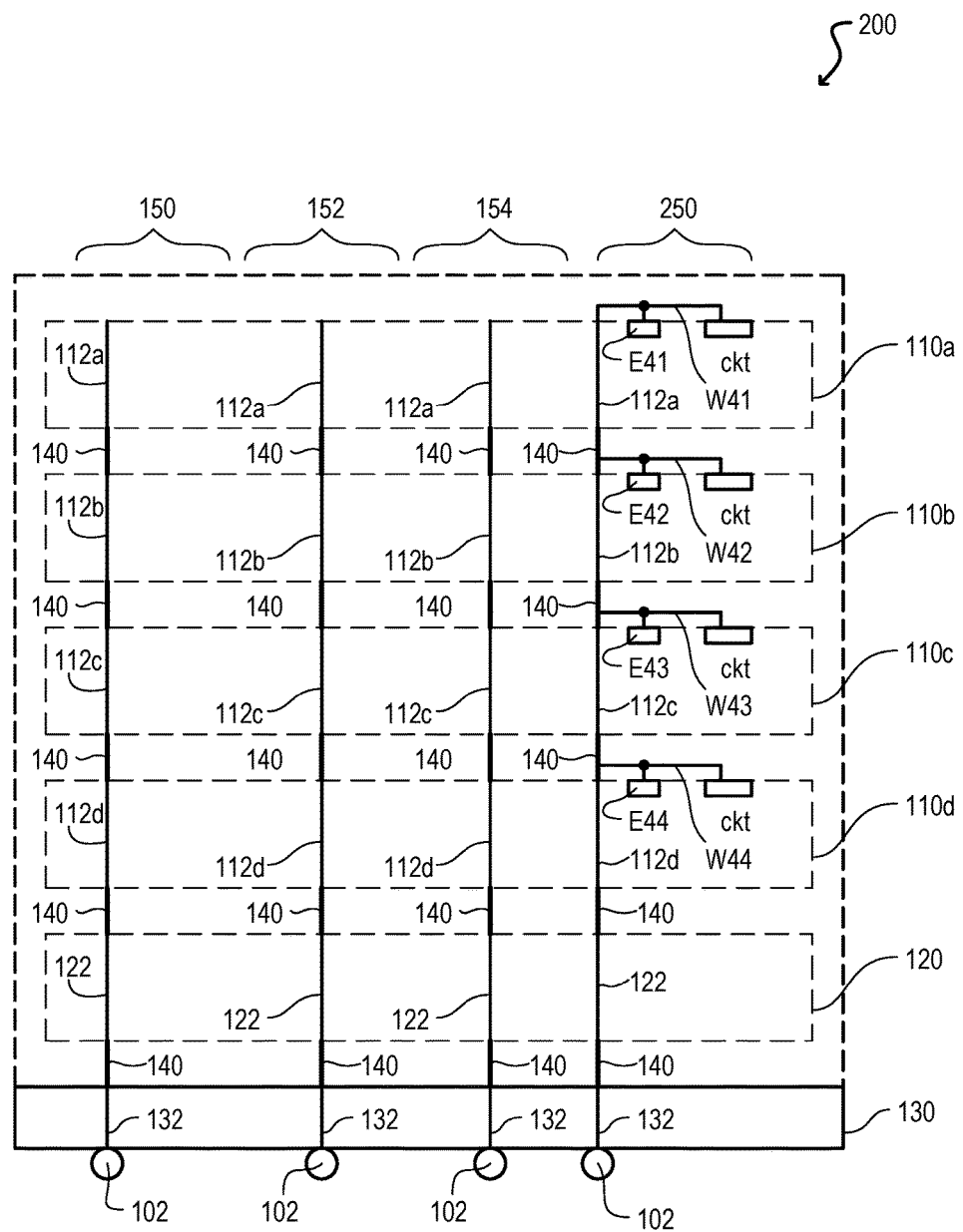
FIG. 2 is a schematic diagram of a package including a plurality of semiconductor devices according to an embodiment.

Referring now to FIG. 2, a package including a plurality of stacked semiconductor devices according to an embodiment is set forth in a schematic diagram and given the general reference character 200.

The package of FIG. 2 includes the many of the same constituents as package 100 of FIG. 1. Such constituents will have the same reference character. Package 200 includes externally connected structures (150, 152, and 154) having ESD protection circuits as discussed with above with respect to FIG. 1. The ESD protection circuits and circuitry for externally connected structures (150, 152, and 154) are not shown in FIG. 2 to avoid unduly cluttering the figure. Package 200 also includes externally connected structure 250. Externally connected structure 250 illustrates a case in which circuitry on semiconductor devices (110a to 110d) are all electrically connected to an external connection 102 by way of through vias (112a to 112d, and 122), electrical interface connections 140, wiring 132, and respective wirings (W41 to W44). Each semiconductor device (110a to 110d) can include a respective ESD protection circuit (E41 to E44). ESD protection circuit E41 may be connected by wiring W41 and may intervene circuitry ckt on semiconductor device 110a and external connection 102. ESD protection circuit E42 may be connected by wiring W42 and may intervene circuitry ckt on semiconductor device 110b and external connection 102. ESD protection circuit E43 may be connected by wiring W43 and may intervene circuitry ckt on semiconductor device 110c and external connection 102. ESD protection circuit E44 may be connected by wiring W44 and may intervene circuitry ckt on semiconductor device 110d and external connection 102.

It is noted that ESD protection circuits (E41 to E44) are commonly connected to external connection 102 in externally connected structure 250. Thus, they can provide parallel current paths in case of an ESD event. Because the area (surface area of the semiconductor device taken up by the ESD protection circuit) of the ESD protection circuit is proportional to the current capabilities, ESD protection circuits (E41 to E44) may be substantially smaller than ESD protection circuits (E15, E25, and E31). ESD protection circuits (E41 to E44) may each have an area (active area) of less than ½ the area of ESD protection circuits (E15, E25, and E31). Thus, chip size can be reduced over conventional cases in which the same size ESD protection circuits are used. This can reduce manufacturing costs by providing more chips per wafer.

Figure 3:
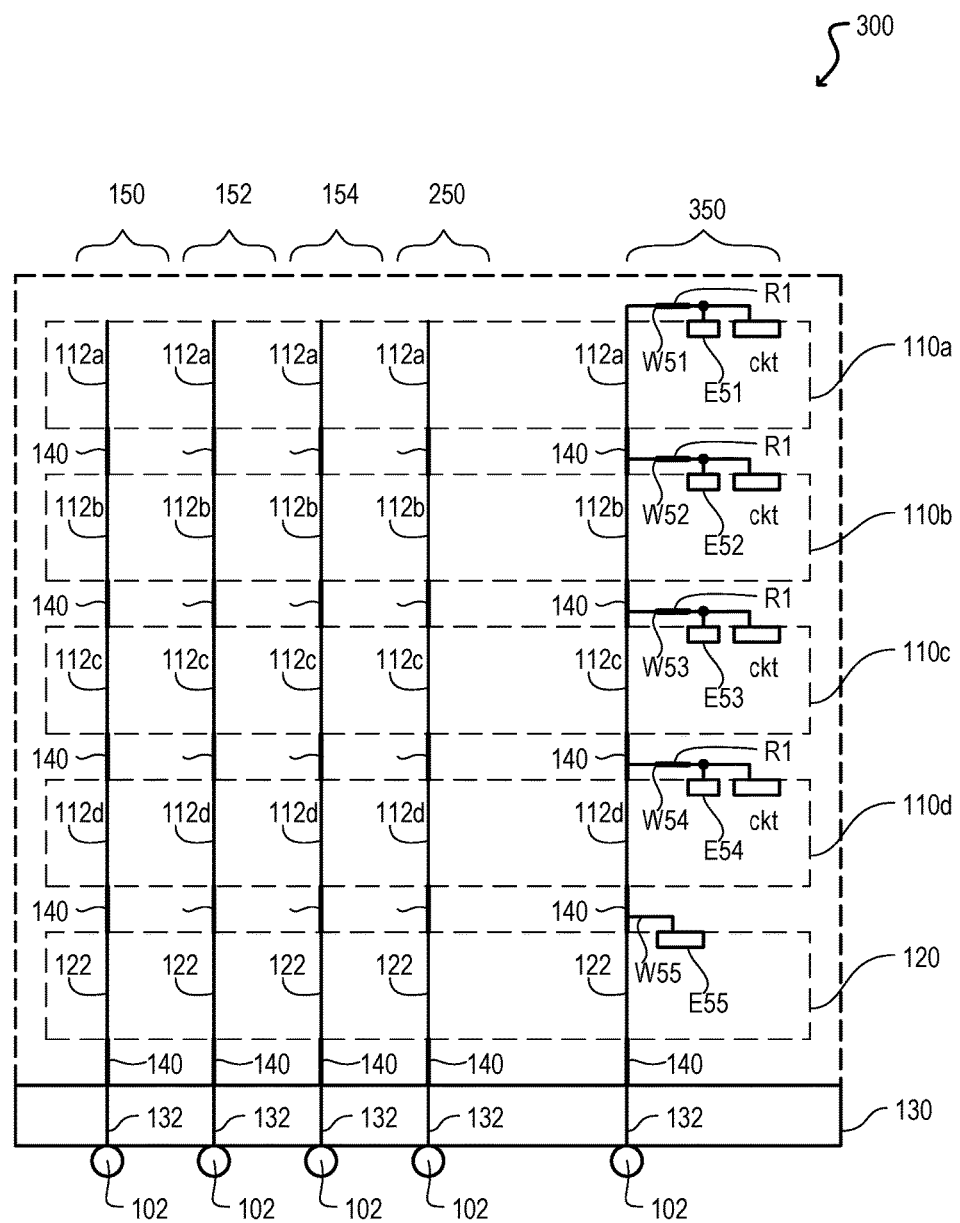
FIG. 3 is a schematic diagram of a package including a plurality of semiconductor devices according to an embodiment.

Referring now to FIG. 3, a package including a plurality of stacked semiconductor devices according to an embodiment is set forth in a schematic diagram and given the general reference character 300.

The package of FIG. 3 includes the many of the same constituents as package 200 of FIG. 2. Such constituents will have the same reference character. Package 300 includes externally connected structures (150, 152, 154, and 250) having ESD protection circuits as discussed with above with respect to FIG. 1 and FIG. 2. The ESD protection circuits and circuitry for externally connected structures (150, 152, 154, and 250) are not shown in FIG. 3 to avoid unduly cluttering the figure. Package 300 also includes externally connected structure 350. Externally connected structure 350 illustrates a case in which circuitry on semiconductor devices (110a to 110d) are all electrically connected to an external connection 102 by way of through vias (112a to 112d, and 122), electrical interface connections 140, wiring 132, and respective wirings (W51 to W54). Each semiconductor device (110a to 110d) may include circuitry ckt electrically connected to a respective wiring (W51 to W54).

Bottom semiconductor device 120 may include an ESD protection circuit E55 that is electrically connected to an external connection by way of wiring 132, electrical interface connection 140, through via 122, and wiring W35. The ESD protection circuit E55 may provide protection in case of an ESD event.

Externally connected structure 350 may differ from external connection structure 150 in that each wiring W51 to W54 on respective semiconductor devices (110a to 110d) may have a resistor R1 intervening the respective through via (112a to 112d) and the respective circuitry ckt. Resistor R1 may have a resistance value substantially greater than the resistance value of wiring W55 on bottom semiconductor device W55. Each semiconductor device (110a to 110d) may include a respective ESD protection circuit (E51 to E54) electrically connected to a respective wiring (W51 to W54) between a second terminal of a resistor R1 and respective circuitry ckt. Each resistor R1 may have a first terminal electrically connected to a respective through via (112a to 112d).

Each resistor R1 may include a polysilicon resistor and/or a diffusion resistor (i.e. silicon doped with an n-type or p-type dopant) providing a substantially greater resistance value ($\Omega$, i.e. ohm) and resistivity ($\Omega \cdot$meter) than a wiring (W51 to W55). Each wiring (W51 to W55) may include a conductive metal (i.e. aluminum, tungsten, copper, or the like).

ESD protection circuits (E51 to E54) may essentially be of the same structure but substantially smaller than ESD protection circuit E55. In other words, ESD structure E55 may sink a greater current in case of an ESD event. ESD structures (E51 to E54) may be provided to provide an extra protection from, for example, having control gates of insulated gate field effect transistors (IGFETs) in circuitry ckt from having a high enough voltage to damage a gate insulating layer. In particular, ESD protection circuit E55 may be at least 2 times as large (in active surface area) as each one of ESD protection circuits (E51 to E54).

Furthermore, ESD protection circuits (E51 to E54) may have a different trigger voltage than ESD protection circuit E55 (trigger voltage Vtrigger will be explained with reference to FIG. 5 below). In particular, ESD protection circuits (E51 to E54) may have a lower trigger voltage than ESD protection circuit E55.

ESD protection circuits (E51 to E54) may provide protection during manufacturing of each semiconductor device (110*a* to 110*d*) and may provide protection for circuitry ckt in each semiconductor device (110*a* to 110*d*) under charged device model type ESD events. Charged device model ESD events are when, for example, package (100 to 300) or semiconductor device (110*a* to 110*d*) becomes charged during manufacturing or assembly.

ESD protection circuit E55 may have a turn on time in which the ESD protection circuit E55 goes from a forward blocking mode to a forward conduction mode when there is an ESD event. The resistance value of resistor R1 may be selected to provide an RC value greater than the turn on time (also known as a transition time) of ESD protection circuit E55, where C is essentially the input capacitance value of circuitry ckt. In this way, when there is an ESD event at the external connection 102 of externally connected structure 350, ESD protection circuit E55 may turn on to conduct the current before ESD protection circuits (E51 to E54).

By only having a ESD protection circuit (E51 to E54) on each semiconductor device (110*a* to 110*d*) in externally connected structure 350, chip size may be reduced and more chips per wafer may be manufactured thereby reducing manufacturing costs.

Examples of ESD events in which ESD protection circuits can protect include charge from a human body or a device. These events can generate voltages from a few volts to a few thousand volts.

Examples of ESD protection circuits that may be used as ESD protection circuits (E15, E25, E31, E41 to E44, and E51 to E55) are now to be discussed with reference to various figures.

Figure 4:
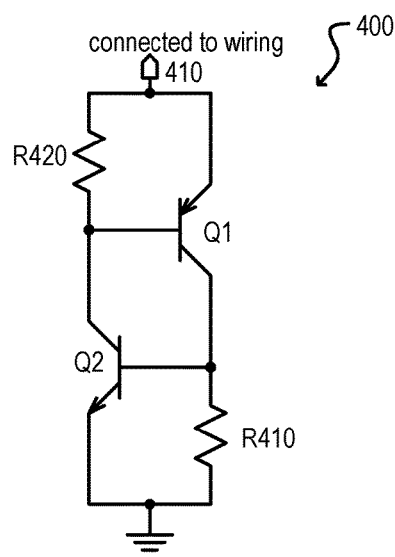
FIG. 4 is a circuit schematic diagram of an ESD protection circuit.

Referring now to FIG. 4, an ESD protection circuit is set forth in a circuit schematic diagram and given the general reference character 400.

ESD protection circuit 400 is a semiconductor controlled rectifier (SCR). ESD protection circuit 400 can include a PNP bipolar transistor Q1 and a NPN bipolar transistor Q2 coupled between a wiring (for example, any of wirings W15, W25, W31, W41 to W44, and W51 to W55) and a ground or Vss reference, for example. The emitter of PNP bipolar transistor Q1 may be connected to the wiring at terminal 410. A resistor R420 may be coupled between the base of pnp bipolar transistor Q1 and terminal 410. The base of PNP bipolar transistor Q1 may be connected to the collector of NPN bipolar transistor Q2. The collector of pnp bipolar transistor Q1 may be connected to the base of NPN bipolar transistor Q2. A resistor R410 may have a first terminal connected to the base of NPN bipolar transistor Q2 and a second terminal connected to a ground or Vss reference. The emitter of NPN bipolar transistor Q2 may be connected to a ground or Vss reference.

Figure 5:
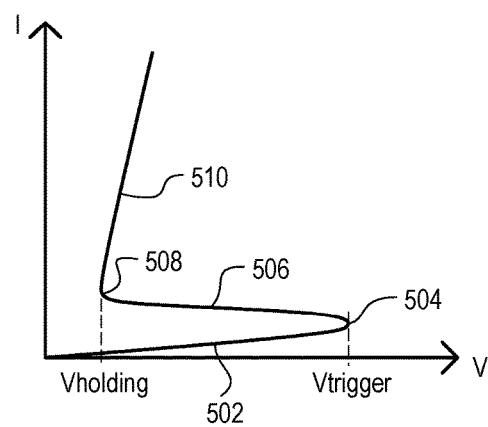
FIG. 5 is a current-voltage diagram of an ESD protection circuit.

Referring now to FIG. 5, a current-voltage diagram of a ESD protection circuit is set forth.

FIG. 5 is a current-voltage diagram of a typical ESD protection circuit. For example, FIG. 5 may be a current-voltage (I-V) diagram of SCR 400.

For example, the current voltage diagram of FIG. 5 shows the SCR 400 in a forward blocking region 502 in which there is minimal leakage current, which occurs when there is no ESD event. Once an ESD event occurs and the voltage spikes above a trigger voltage Vtrigger shown at point 504 in the I-V diagram of FIG. 5, the SCR 400 snaps back through snap back region 506 toward a minimum holding voltage Vholding at point 508. Then in the holding region 510, the SCR functions as a near ideal switch, the slope in holding region 510 represents the on resistance of the SCR 400. This slope is proportional to the size of the SCR 400, thus a larger SCR 400 dissipates more current at a lower holding voltage in the holding region.

The above-mentioned snap back regions 506 and holding regions 510 may essentially constitute the forward conduction mode as discussed above with respect to the turn on time or transition time of ESD protection circuit E55.

Figure 6:
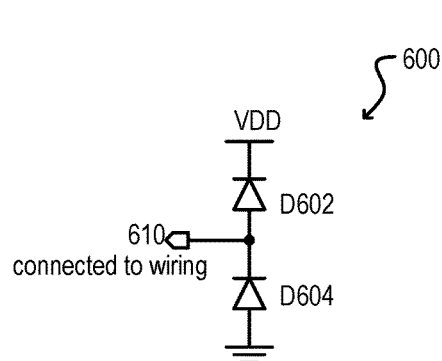
FIG. 6 is a circuit schematic diagram of an ESD protection circuit.

Referring now to FIG. 6, an ESD protection circuit is set forth in a circuit schematic diagram and given the general reference character 600.

ESD protection circuit 600 may include diodes (D602 and D604). Diode D602 may have a cathode terminal electrically connected to a power supply VDD and an anode terminal electrically connected to a cathode of diode D604 at an input terminal 610. Diode D604 may have an anode electrically connected to a ground or Vss reference. Input terminal 610 may be electrically connected to a wiring (for example, any of wirings W15, W25, W31, W41 to W44, and W51 to W55).

Figure 7:
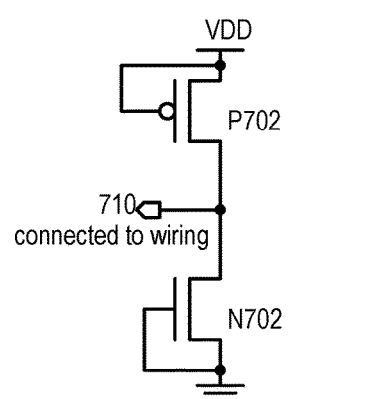
FIG. 7 is a circuit schematic diagram of a ESD protection circuit.

Referring now to FIG. 7, an ESD protection circuit is set forth in a circuit schematic diagram and given the general reference character 700.

ESD protection circuit 700 may include insulated gate field effect transistors (IGFETs) (P702 and N702). IGFET P702 may have a gate and a source terminal commonly connected to a power supply VDD and a drain terminal commonly connected to a drain terminal of IGFET N702 at an input terminal 710. IGFET N702 may have a gate and a source terminal commonly connected to a ground or Vss reference. Input terminal 710 may be electrically connected to a wiring (for example, any of wirings W15, W25, W31, W41 to W44, and W51 to W55). IGFET P702 may be a p-type IGFET and IGFET N702 may be an n-type IGFET.

ESD protection circuit 700 may be referred to as a grounded gate IGFET ESD structure.

In externally connected structure 350 in package 300 of FIG. 4, ESD protection circuit 700 may be used for each of ESD protection circuits (E51 to E54) while ESD protection circuit 400 may be used for ESD protection circuit E55 in a particular embodiment.

Figure 8:
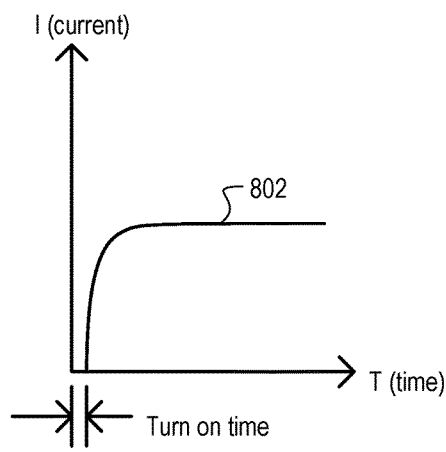
FIG. 8 is a current (I) versus time (T) diagram of an ESD protection circuit during an ESD event.

Referring now to FIG. 8, a current (I) versus time (T) diagram of an ESD protection circuit during an ESD event is set forth. At time zero (where the lines for time and current meet), an ESD event occurs. The delay time or transit time of the ESD circuit is illustrated as the time from which the ESD event occurs until the forward conduction mode of operation begins. This is illustrated as when current (802) begins a sharp rise.

Figure 9:
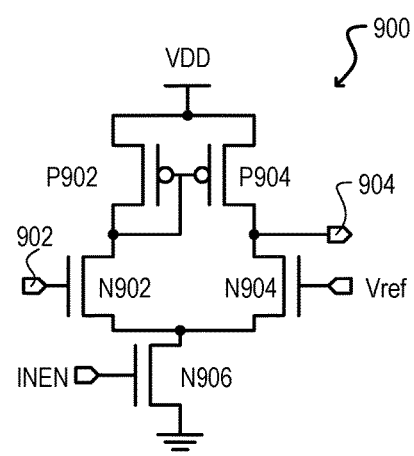
FIG. 9 is a circuit schematic diagram of an input buffer circuit.
Figure 10:
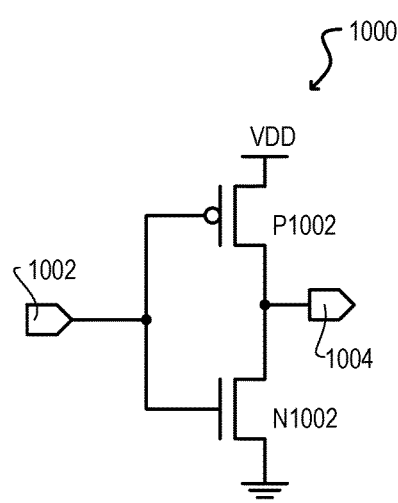
FIG. 10 is a circuit schematic diagram of an output buffer circuit.

FIGS. 9 and 10 set forth various embodiments of circuitry ckt that can be electrically connected to external structures (150, 152, 154, 250, and 350) in packages (100, 200, and 300). FIG. 9 is a circuit schematic diagram of an input buffer circuit 900. FIG. 10 is a circuit schematic diagram of an output buffer circuit 1000.

Referring now to FIG. 9, input buffer circuit 900 can be a differential amplifier circuit receiving a reference potential Vref at one input terminal. Another input terminal 902 may be electrically connected to a wiring (such as wirings W11-W15, W21-W24, W31, W41-W44, and/or W51-W54). Input buffer circuit 900 may provide an output at an output terminal 904. The output at terminal 904 may be a buffered version of an input received at input terminal 902 when an input enable signal INEN is at an enable logic level.

Input buffer circuit 900 can include IGFETs (P902, P904, N902, N904, and N906). IGFETs (P902 and P904) can be p-type IGFETs and IGFETs (N902, N904, and N906) may be n-type IGFETs. IGFET N906 can have a source terminal connected to receive a ground or Vss reference potential, a gate terminal connected to receive an input enable signal INEN and a drain terminal commonly connected to source terminals of IGFETs (N902 and N904). IGFET N902 can have a gate terminal connected to input terminal 902 and a drain terminal commonly connected to a drain terminal of IGFET P902 and gates terminals of IGFETs (P902 and P904). IGFET N904 can have a gate terminal connected to receive reference potential Vref and a drain terminal commonly connected to an output terminal 904 and a drain terminal of IGFET P904. IGFETs (P902 and P902) can have source terminals commonly connected to a power supply potential VDD.

ESD protection circuitry (E15, E25, E31, E41-E44, and/or E51-E55) may provide protection for a gate insulating layer formed under the gate terminal of IGFET N902.

Referring now to FIG. 10, output buffer 1000 may essentially be a driver circuit. Output buffer may receive an input at an input terminal 1002 and may provide an output at an output terminal 1004. Output terminal may be electrically connected to a wiring (such as wirings W11-W15, W21-W24, W31, W41-W44, and/or W51-W54).

Output buffer 1000 may include IGFETs (P1002 and N1002). IGFET P1002 may be a p-type IGFET. IGFET N1002 may be an n-type IGFET. IGFET N1002 may have a source terminal connected to a ground or Vss reference potential. IGFET N1002 may have a gate terminal commonly connected to input terminal 1002 and a gate terminal of IGFET P1002. IGFET N1002 may have a drain terminal commonly connected to output terminal 904 and a drain of IGFET P1002. IGFET P1002 may have a source connected to a power supply potential VDD.

ESD protection circuitry (E15, E25, E31, E41-E44, and/or E51-E55) may provide protection for drain terminals of IGFETs (N1002 and P1002).

In yet another embodiment, circuitry ckt that can be electrically connected to external structures (150, 152, 154, 250, and 350) in packages (100, 200, and 300) may be both input buffer circuit 900 and output buffer circuit 1000 forming a bidirectional data, for example, a DQ pin in a semiconductor memory device. In this case, ESD protection circuitry (E15, E25, E31, E41-E44, and/or E51-E55) may provide protection for both drains and gates of various IGFETs.

Figure 11:
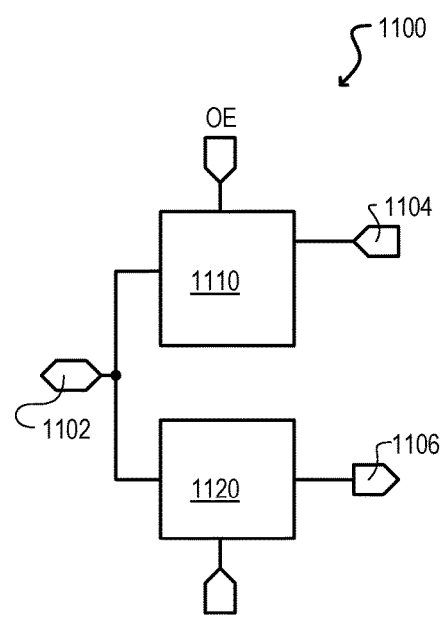
FIG. 11 is a block schematic diagram of an input/output buffer circuit.

Such an example is illustrated in FIG. 11. FIG. 11 is a block schematic diagram of an input/output buffer circuit 1100. Input/output buffer circuit 1100 can include an output buffer circuit 1110 and an input buffer circuit 1120. Output buffer circuit 1110 and input buffer circuit 1120 may be commonly connected to an input/output terminal 1102. Output buffer circuit 1110 may receive an output enable signal OE at an output enable terminal and may receive a data signal at an input terminal 1104. Output buffer circuit 1110 may provide the data signal to the input/output terminal 1102 when output enable signal OE has an enable logic level and may be in a high impedance state when output enable signal has a disable logic level. Input buffer circuit 1120 may receive an input enable signal INEN at an input enable terminal and may provide a data signal at an output terminal 1106. Input buffer circuit 1120 may receive a data input signal at input/output terminal 1102 and may provide the data signal to output terminal 1106 when input enable signal INEN has an enable logic level. Input buffer circuit 1120 may be disabled when input enable signal INEN has a disable logic level.

When input/output buffer circuit 1100 corresponds to circuitry ckt, input/output terminal 1102 may be electrically connected to a wiring (such as wirings W11-W15, W21-W24, W31, W41-W44, and/or W51-W54).

Figure 12:
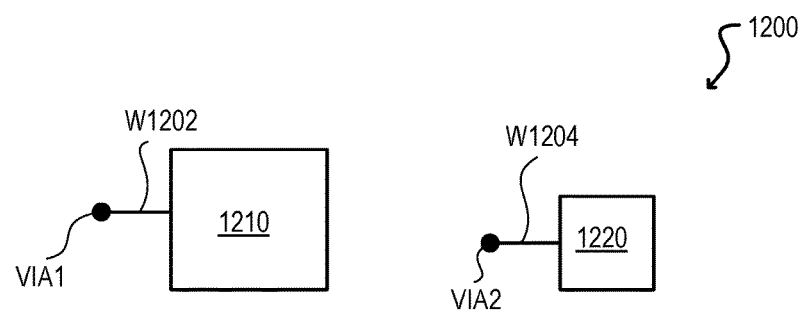
FIG. 12 is a top plan view of ESD protection circuits formed on a first surface of a semiconductor device substrate according to an embodiment.

Referring now to FIG. 12, a top plan view of ESD protection circuits (1210 and 1220) formed on a first surface of a semiconductor device substrate 1200 according to an embodiment is set forth. As mentioned above, ESD protection circuits (E41 to E44) may each have an area (active area) of less than ½ the area of ESD protection circuits (E15, E25, and E31) and ESD protection circuit E55 may be at least 2 times as large (in active surface area) as each one of ESD protection circuits (E51 to E54). ESD protection circuit 1210 may illustrate an example of an active area (in which components are formed in an upper surface of a substrate) for the larger ESD protection circuits (E15, E25, E31, and E55). ESD protection circuit 1220 may illustrate an example of an active area for the smaller ESD protection circuits (E41 to E44 and E51 to E54). As previously mentioned, current sinking capabilities of an ESD protection circuit may be essentially proportional to the active area. The area of ESD protection circuit 1220 may be less than ½ of the ESD protection circuit 1210. In this way, ESD protection circuit 1210 may sink substantially higher current.

ESD protection circuit 1210 may be connected to a through via VIA1 by a wiring W1202. ESD protection circuit 1220 may be connected to a through via VIA2 by a wiring 1204. To avoid unduly cluttering up the figure, connected circuits, such as circuits ckt in FIGS. 1 to 3 which may also be connected to respective wiring W1202 and W1204 are not illustrated in FIG. 12.

In the embodiments, by essentially providing smaller ESD protection circuits 1220 to provide parallel current paths in the examples of externally connected structures (250 and 350) chip size may be reduced with an area efficient ESD structure.

Semiconductor devices (110a to 110d) may be semiconductor memory devices and semiconductor device 120 may be a semiconductor memory controller that controls operation of semiconductor devices (110a to 110d).

In the embodiments, circuitry ckt is an electrical circuit, other than an ESD protection circuit, that has active electrical components, such as a transistor or diode, for example. This is different than just passive components, such as resistors, inductors, and capacitors, for example.

Electrically connected is a term used to indicate two points are connected by means of a conducting path.

Other electrical apparatus other than semiconductor devices may benefit from the invention.

While various particular embodiments set forth herein have been described in detail, the present invention could be subject to various changes, substitutions, and alterations without departing from the spirit and scope of the invention.

Accordingly, the present invention is intended to be limited only as defined by the appended claims.

What is claimed is:

1. A multi-chip device, comprising:
a plurality of stacked semiconductor devices including a top semiconductor device, a middle semiconductor device, and a bottom semiconductor device;
a first electrostatic discharge (ESD) protection circuit and a first circuit formed in the top semiconductor device;
a second ESD protection circuit and a second circuit formed in the middle semiconductor device;
a first external electrical connection formed on a bottom of the multi-chip device, the first external electrical connection providing a first electrical connection external to the multi-chip device, the bottom semiconductor device formed between the first external electrical connection and the middle semiconductor device;
a first through via providing an electrical connection through the bottom semiconductor device from a first surface to an opposite surface of the bottom semiconductor device, the first through via is coupled to provide an electrical connection between the first external electrical connection and the first circuit, the first ESD protection circuit, the second circuit, and the second ESD protection circuit;
a third ESD protection circuit formed in the bottom semiconductor device;
a second external electrical connection formed on the bottom of the multi-chip device, the second external electrical connection providing a second electrical connection external to the multi-chip device; and
each of the first and second ESD protection circuits have a smaller surface area than the third ESD protection circuit.

2. The multi-chip device of claim 1, further including:
the first ESD protection circuit takes up a first surface area on the top semiconductor device;
the second ESD protection circuit takes up a second surface area on the middle semiconductor device, and the third ESD protection circuit takes up a third surface area on the bottom semiconductor device wherein each of the first surface area and the second surface area are less than about one-half the third surface area.

3. The multi-chip device of claim 1, wherein:
the top semiconductor device includes a first wiring electrically connected between the first ESD protection circuit and the first external electrical connection wherein the first ESD protection circuit is a semiconductor controlled rectifier coupled between the first wiring and a first reference potential.

4. The multi-chip device of claim 1, wherein:
the top semiconductor device includes a first wiring electrically connected between the first ESD protection circuit and the first external electrical connection wherein the first ESD protection circuit includes a first insulated gate field effect transistor (IGFET) having a source/drain path coupled between the first wiring and a first reference potential and a control gate coupled to the first reference potential.

5. The multi-chip device of claim 4, further including:
the first ESD protection circuit includes a second IGFET having a source/drain path coupled between the first wiring and a power supply potential and a control gate coupled to the power supply potential.

6. The multi-chip device of claim 1, wherein:
the top semiconductor device includes a first wiring electrically connected between the first ESD protection circuit and the first external electrical connection wherein the first ESD protection circuit includes a first diode coupled between the first wiring and a first reference potential.

7. The multi-chip device of claim 6, wherein:
the first ESD protection circuit includes a second diode coupled between the first wiring and a power supply potential.

8. The multi-chip device of claim 1, wherein:
the first circuit is an input buffer circuit receiving an input signal at a first terminal and providing an output signal at a second terminal, the first terminal is electrically connected to the first external electrical connection.

9. The multi-chip device of claim 8, wherein:
the input buffer circuit is coupled to receive an input enable signal.

10. The multi-chip device of claim 8, wherein:
the input buffer includes a differential amplifier circuit having a first amplifier input terminal coupled to the first terminal and a second amplifier input terminal coupled to receive a reference potential.

11. The multi-chip device of claim 1, wherein:
the first circuit is an output buffer circuit providing an output signal at a first terminal, the first terminal is electrically connected to the first external electrical connection.

12. The multi-chip device of claim 1, wherein:
the first circuit includes
an input buffer circuit receiving a data signal at a first terminal, the input buffer circuit receives an input enable signal and provides the data signal at a second terminal when the input enable signal has an input enable logic level, the first terminal is electrically connected to the first external electrical connection; and
an output buffer circuit receiving a data signal at a third terminal, the output buffer circuit receives an output enable signal and provides the data signal to the first terminal when the output enable signal has an output enable logic level.

13. The multi-chip device of claim 1, further including:
an electrical interface connection formed between the top semiconductor device and the middle semiconductor device and electrically connected between the first circuit and the first through via.

14. The multi-chip device of claim 13, wherein:
the electrical interface connection is a solder ball.

15. The multi-chip device of claim 13, wherein:
the electrical interface connection is a copper pillar.

16. The multi-chip device of claim 1, wherein:
an interposer disposed between the bottom semiconductor device and the first external electrical connection wherein the interposer includes a first interposer wiring providing an electrical connection between the first external electrical connection and the first through via.

17. The multi-chip device of claim 1, further including:
a second through via providing an electrical connection through the middle semiconductor device from a first surface to an opposite surface of the middle semiconductor device, the second through via is coupled to provide an electrical connection between the first through via and the first circuit.

18. The multi-chip device of claim 1, wherein:
the first circuit and the second circuit each include at least one insulated gate field effect transistor (IGFET).

19. The multi-chip device of claim 1, wherein:
the bottom semiconductor device being free of an ESD
   protection circuit connected to the first through via.

\* \* \* \* \*